(12) United States Patent
Goda

(10) Patent No.: US 9,484,100 B2
(45) Date of Patent: Nov. 1, 2016

(54) MEMORY DEVICES HAVING SOURCE LINES DIRECTLY COUPLED TO BODY REGIONS AND METHODS

(71) Applicant: Micron Technology, Inc., Boise, ID (US)

(72) Inventor: Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/299,813

(22) Filed: Jun. 9, 2014

(65) Prior Publication Data

US 2014/0286106 A1 Sep. 25, 2014

Related U.S. Application Data

(62) Division of application No. 13/011,223, filed on Jan. 21, 2011, now Pat. No. 8,750,040.

(51) Int. Cl.
*G11C 16/04* (2006.01)
*G11C 16/10* (2006.01)
*H01L 27/115* (2006.01)

(52) U.S. Cl.
CPC ......... *G11C 16/10* (2013.01); *H01L 27/11524* (2013.01); *H01L 27/11556* (2013.01)

(58) Field of Classification Search
CPC .............. G11C 16/10; G11C 16/0466; G11C 16/0483; G11C 7/00
USPC .......................... 365/185.29, 185.18, 185.17
See application file for complete search history.

(56) References Cited

U.S. PATENT DOCUMENTS

| | | | | |
|---|---|---|---|---|
| 4,827,448 | A * | 5/1989 | Kuo | ............................... 257/296 |
| 5,721,871 | A * | 2/1998 | Ginsberg et al. | ............. 710/200 |
| 5,802,555 | A * | 9/1998 | Shigeeda | ....................... 711/106 |
| 6,118,159 | A | 9/2000 | Willer et al. | |
| 6,718,432 | B1 * | 4/2004 | Srinivasan | ..................... 711/108 |
| 6,744,094 | B2 | 6/2004 | Forbes | |
| 7,369,438 | B2 | 5/2008 | Lee | |
| 7,403,417 | B2 * | 7/2008 | Cohen | ...................... 365/185.09 |
| 8,174,893 | B2 | 5/2012 | Goda et al. | |
| 8,274,108 | B2 | 9/2012 | Katsumata et al. | |
| 8,750,040 | B2 | 6/2014 | Goda | |

(Continued)

FOREIGN PATENT DOCUMENTS

| | | |
|---|---|---|
| CN | 101055875 A | 10/2007 |
| CN | 101461011 A | 6/2009 |

(Continued)

OTHER PUBLICATIONS

"International Application Serial No. PCT/US2012/021873, International Preliminary Report on Patentability mailed Aug. 1, 2013", 6 pgs.

(Continued)

*Primary Examiner* — Tuan T Nguyen
(74) *Attorney, Agent, or Firm* — Schwegman Lundberg & Woessner, P.A.

(57) ABSTRACT

Memory devices, memory cell strings and methods of operating memory devices are shown. Configurations described include directly coupling an elongated body region to a source line. Configurations and methods shown should provide a reliable bias to a body region for memory operations such as erasing.

11 Claims, 5 Drawing Sheets

(56) References Cited

U.S. PATENT DOCUMENTS

| | | |
|---|---|---|
| 2003/0081449 A1* | 5/2003 | Beucler .................. 365/154 |
| 2004/0130942 A1 | 7/2004 | Yeh et al. |
| 2004/0202028 A1* | 10/2004 | Cioaca .................. 365/189.11 |
| 2005/0201182 A1 | 9/2005 | Osada et al. |
| 2006/0054976 A1 | 3/2006 | Verhoeven |
| 2007/0296015 A1 | 12/2007 | Aritome |
| 2008/0002475 A1 | 1/2008 | Yang et al. |
| 2008/0239847 A1* | 10/2008 | Jung et al. .................. 365/203 |
| 2009/0022001 A1 | 1/2009 | Morishita et al. |
| 2009/0207642 A1* | 8/2009 | Shimano et al. ............ 365/72 |
| 2010/0034028 A1 | 2/2010 | Katsumata et al. |
| 2010/0110789 A1* | 5/2010 | Chandrasekhar ... G11C 11/5642 365/185.03 |
| 2010/0177566 A1 | 7/2010 | Kim et al. |
| 2010/0207190 A1 | 8/2010 | Katsumata et al. |
| 2010/0207194 A1 | 8/2010 | Tanaka et al. |
| 2010/0213527 A1 | 8/2010 | Shim et al. |
| 2010/0214838 A1 | 8/2010 | Hishida et al. |
| 2010/0232224 A1 | 9/2010 | Maeda et al. |
| 2010/0244119 A1 | 9/2010 | Fukuzumi et al. |
| 2011/0103153 A1 | 5/2011 | Katsumata et al. |
| 2012/0134215 A1* | 5/2012 | Goda .................. 365/185.33 |
| 2012/0188825 A1 | 7/2012 | Goda |
| 2013/0178025 A1 | 7/2013 | Haller et al. |
| 2013/0194867 A1 | 8/2013 | Fukuda et al. |
| 2014/0313833 A1* | 10/2014 | Liu et al. .................. 365/185.17 |
| 2016/0049192 A1* | 2/2016 | Lee .................. G11C 16/3427 365/185.03 |

FOREIGN PATENT DOCUMENTS

| | | |
|---|---|---|
| CN | 101515478 A | 8/2009 |
| CN | 101764096 A | 6/2010 |
| CN | 103329270 A | 9/2013 |
| JP | 2005260014 A | 9/2005 |
| JP | 2010166055 A | 7/2010 |
| JP | 2010199235 A | 9/2010 |
| JP | 2010212518 A | 9/2010 |
| JP | 2010225946 A | 10/2010 |
| KR | 1020090017587 A | 2/2009 |
| TW | 201237874 A | 9/2012 |
| WO | WO-2012100056 A2 | 7/2012 |

OTHER PUBLICATIONS

"International Application Serial No. PCT/US2012/021873, International Search Report mailed Jul. 30, 2012", 3 pgs.

"International Application Serial No. PCT/US2012/021873, Written Opinion mailed Jul. 30, 2012", 4 pgs.

"Chinese Application Serial No. 201280006100.4, Amendment filed May 9, 2014", w/English Claims, 10 pgs.

Chinese Application Serial No. 201280006100.4, Office Action mailed Oct. 13, 2014, 10 pgs.

Japanese Application Serial No. 2013-550579, Office Action mailed Jun. 2, 2015, 15 pgs.

Japanese Application Serial No. 2013-550579, Response filed Aug. 31, 2015 to Office Action mailed Jun. 2, 2015, 7 pgs.

* cited by examiner

MEMORY DEVICES HAVING SOURCE LINES DIRECTLY COUPLED TO BODY REGIONS AND METHODS

PRIORITY APPLICATION

This application is a divisional of U.S. application Ser. No. 13/011,223, filed Jan. 21, 2011, which is incorporated herein by reference in its entirety.

BACKGROUND

Higher memory density is always in demand to provide smaller devices with higher memory capacity. Forming memory devices laterally on a surface of a semiconductor chip uses a great deal of chip real estate. Improved memory devices are needed with new configurations to further increase memory density beyond traditional laterally formed memory devices.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical changes, etc. may be made.

The term "horizontal" as used in this application is defined as a plane parallel to the conventional plane or surface of a substrate, such as a wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

Figure 1:
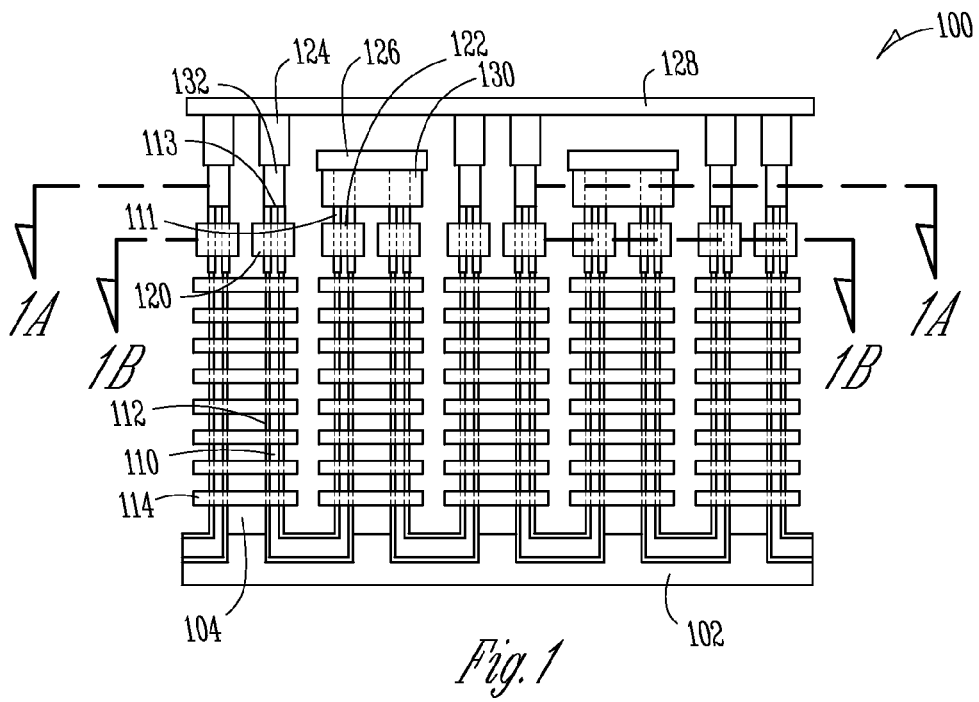
FIG. 1 shows a memory device according to an embodiment of the invention.
Figure 1A:
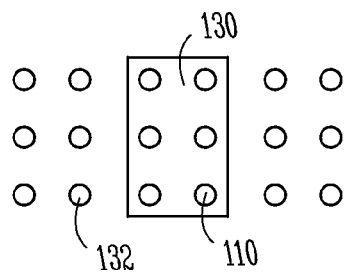
FIG. 1A shows a cross section along line 1A-1A from FIG. 1 according to an embodiment of the invention.
Figure 1B:
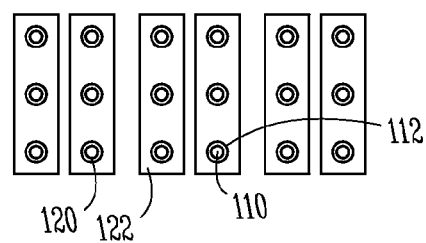
FIG. 1B shows a cross section along line 1B-1B from FIG. 1 according to an embodiment of the invention.

FIGS. 1, 1A, and 1B show a memory device 100 formed on a substrate 102. A charge storage layer(s) 112 (e.g., a combination of a tunnel dielectric layer, a polysilicon layer, and a charge blocking layer; a combination of a nitride layer, an oxide layer, and a nitride layer; or other any other layer or combination of layers that can provide a charge storage function, whether currently known or future developed), substantially surrounds an elongated body region 110 to form a respective charge structure corresponding to each of a plurality of gates 114 (which may also substantially surround respective cross sections of the elongated body region 110 and charge storage layer(s) 112). A first select gate 120 and a second select gate 122 are shown to selectively couple the elongated body region 110 to drain region 132 and a source region 130, respectively. A dielectric 104 can fill in spaces between components such as those described above.

FIG. 1A shows an embodiment where the elongated body region 110 forms a "U" shape with a pair of upward facing ends 111, 113. Another example configuration (not shown) includes a linear, vertical, elongated body region 110 with one end facing upward, and the other end facing downward. Another example configuration (not shown) includes a horizontal, linear, elongated body region 110 with ends on either side. Embodiments with two upward facing ends, 111, 113, such as the "U" shaped configuration, can enable easier formation of some components at the ends 111, 113 of the elongated body region 110 during manufacture, compared to embodiments where components are formed deeper in the structure.

In one example, the elongated body region 110 is formed from a p type semiconductor material, such as p-type polysilicon. The elongated body region 110 can be formed in multiple process steps, such as where a first end 111 is formed in a different polysilicon deposition step than that used to form other portions of the elongated body region 110, such as second end 113. Accordingly, in at least some embodiments, first end 111 may be higher than second end 113. A source region 130 and a drain region 132 are shown coupled to the first end 111 and the second end 113 of the elongated body region 110, respectively. In one example, the source region 130 and the drain region include n type semiconductor material, such as n+ polysilicon. In operation, the pathway of source region 130, to elongated body region 110, to drain region 132 acts as an n-p-n transistor, with select gates 120, 122, and gates 114 operating to allow, or inhibit signal transmission along the way.

A source line 126 and a data line, such as bitline 128, are shown coupled to the source region 130 and the drain region 132 respectively. In one embodiment, a plug 124 is used to directly couple (e.g., directly physically connect to form an electrical connection, or otherwise form an electrical connection without a potential for a n-p or p-n junction breakdown) the bitline 128 to the drain region 132. Each of the source line 126, bitline 128 and plug 124 can comprise, consist of, or consist essentially of metal, such as aluminum, copper, or tungsten, or alloys of these or other conductor metals. In the present disclosure, the term "metal" further includes metal nitrides, or other materials that operate primarily as conductors.

As noted above, FIG. 1 shows the drain region 132 directly coupled to the plug 124, which effectively couples the drain region 132 to the bitline 128. The source region 130 is shown directly coupled to the source line 126. The elongated body region 110 is also directly coupled to the source line 126.

The cross section along line 1B-1B shows the select gates 120 and 122. As can be seen in the cross section, in one embodiment, the select gates 120 and 122 are substantially continuous along a row. In this configuration, actuation of a select gate 120 or 122 actuates a plurality of elongated body regions at a time.

The cross section shown along line 1A-1A shows a number of drain regions 132 and a source region 130. As can be seen in the cross section, in one embodiment, the drain regions 132 are separate, while the source region 130 is substantially continuous, with a single source region 130 used for a plurality of elongated body regions 110. In one example the source region 130 substantially surrounds a cross section of a first end 111 of each of a plurality of elongated body regions 110.

By directly coupling the elongated body region 110 to the source line 126, the elongated body region 110 has the ability to be biased, and operate less as a floating body element. Biasing of the elongated body region 110 via a direct coupling can provide reliable memory operations such as an erase operation in particular.

Figure 2A:
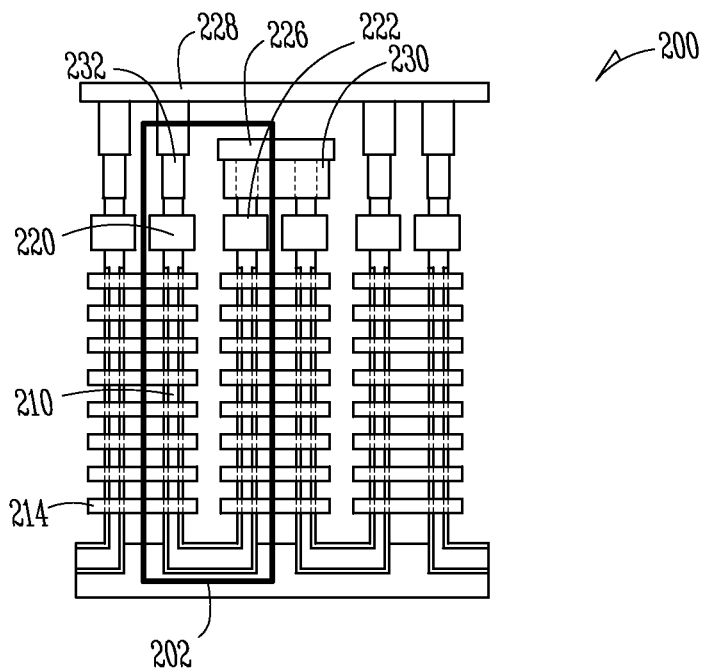
FIG. 2A shows a memory device during an erase operation according to an embodiment of the invention.
Figure 2B:
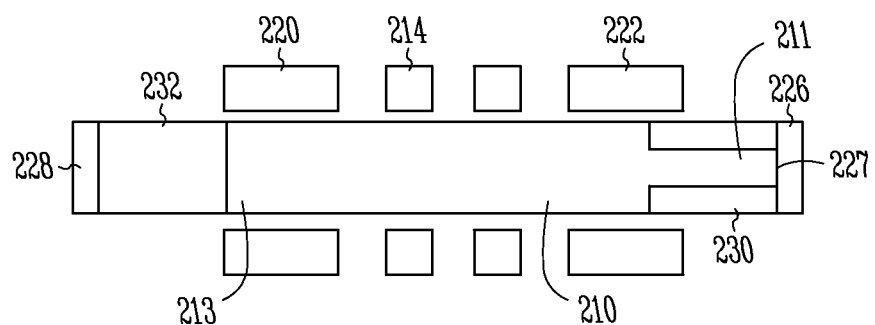
FIG. 2B shows a block diagram of a portion of the memory device from FIG. 2A during an erase operation according to an embodiment of the invention.

An example erase operation, according to an embodiment of the invention, is illustrated with respect to FIGS. 2A and 2B. A memory device 200, similar to embodiments described above, is shown with an example memory cell string 202 circled in the figures. According to one such erase operation embodiment, with the bitline 228 and select gates 220, 222 of string 202 floating, the source line 226, and thus the elongated body region 210 of the string 202, is biased to an erase voltage (e.g., approximately 20 volts), and the gates 214 of the string 202 are biased to a selected voltage (e.g., approximately 0 volts). Given the provided example biasing voltages, the select gates 220, 222 of string 202 are thus coupled up to approximately 15 volts, while the bit line 228 (and plug 124) is coupled up to approximately 20 volts. The potential difference between the body region 110 and gates 214 (e.g., 20 volts to zero volts) is used to erase stored charge from the charge storage structure adjacent to each individual gate 214 in the memory cell string 202.

Because the elongated body region 210 is directly coupled to the source line 226, the elongated body region 210 is biased when a bias is applied to the source line 226. Direct coupling between the elongated body region 210 and the source line 226 provides a charge pathway between the elongated body region 210 and the source line 226 that avoids junction breakdown between an n-type region and a p type region.

In FIG. 2B, the direct coupling of the elongated body region 210 to the source line 226 can be seen at a first end 211 of the elongated body region 210. In contrast, a second end 213 of the elongated body region 210 is indirectly coupled to the bitline 228 through the drain region 232.

Figure 3:
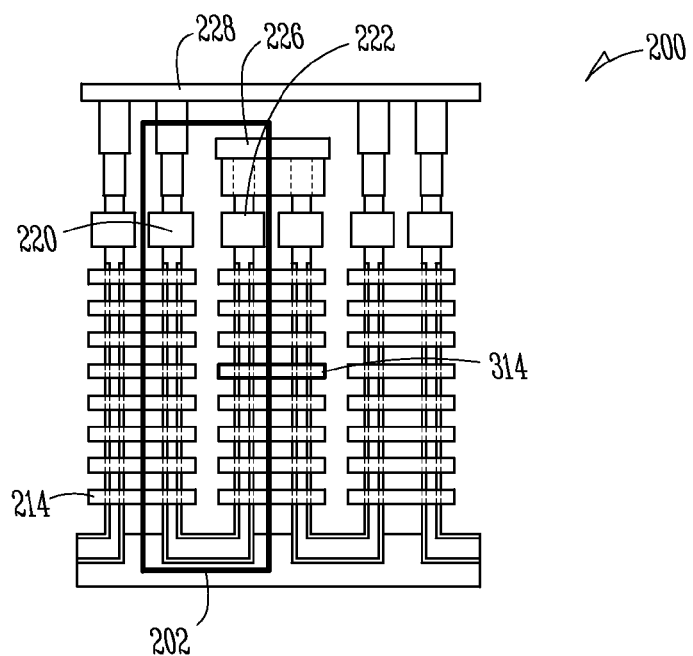
FIG. 3 shows a memory device during a program operation according to an embodiment of the invention.

FIG. 3 shows a memory device 200 undergoing an example program operation according to an embodiment of the invention. The memory device 200 from previous Figures is used as an example. As in FIG. 2A, an example memory cell string 202 is circled.

With FIG. 3 as a reference, the bitline 228, source line 226 and source select gate 222 are biased to respective program enable voltages (e.g., approximately zero volts each). A selected gate 314 is biased with a program voltage (e.g., approximately 20 volts), while the drain select gate 220 of the selected string 202 is biased to, e.g., approximately 2 volts. The potential difference between the selected gate 314 and the body region of the selected string 202 (e.g., 20 volts to zero volts) is used to transfer charge to the charge storage structure adjacent to the selected gate 314 in the selected memory cell string 202. To avoid programming a memory cell corresponding to selected gate 314 in the adjacent, unselected string, the drain select gate of that string can be biased to, for example, approximately zero volts. Unselected gates 214 are biased with an inhibit voltage (e.g., approximately 10 volts) to couple up the body region of the unselected string to an inhibit voltage.

Figure 4:
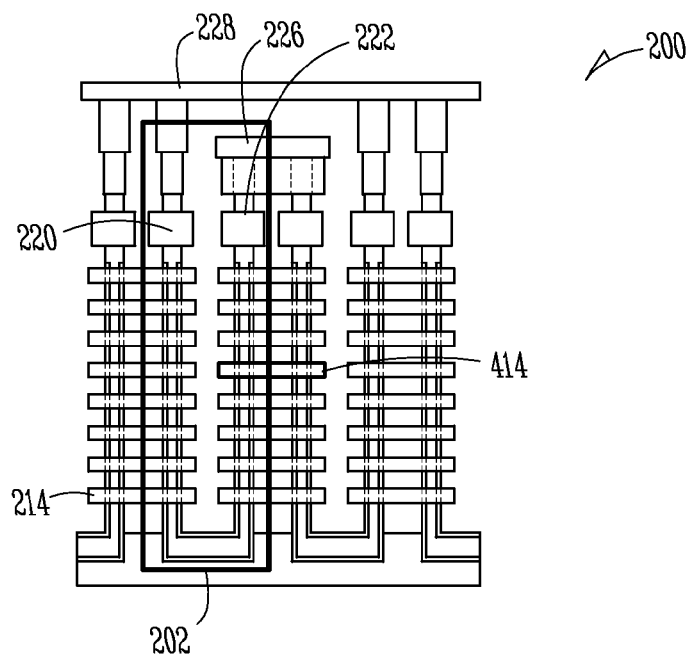
FIG. 4 shows a memory device during a read operation according to an embodiment of the invention.

FIG. 4 shows a memory device 200 undergoing an example read operation according to an embodiment of the invention. The memory device 200 from previous Figures is used as an example. As in previous Figures, an example memory cell string 202 circled.

With FIG. 4 as a reference, the bitline 228 is biased to, for example, approximately 0.5 volts, and the source line 226 is biased to, for example, approximately zero volts. A selected gate 314 is biased with a read voltage (e.g., between approximately 0 volts and approximately 4 volts, such as depending upon what program state is being read), while the drain select gate 220 of the selected string 202 is biased to, e.g., approximately 2 volts. Unselected gates 214 are biased to a pass voltage (e.g., approximately 6 volts) to permit a signal to pass along the elongated body region of the selected string. If gate 314 is erased, then the signal will pass through the elongated body region of the selected string and be detected. To avoid reading a memory cell corresponding to selected gate 314 in an adjacent, unselected string, the drain select gate of that string can be biased to, for example, approximately zero volts.

Figure 5:
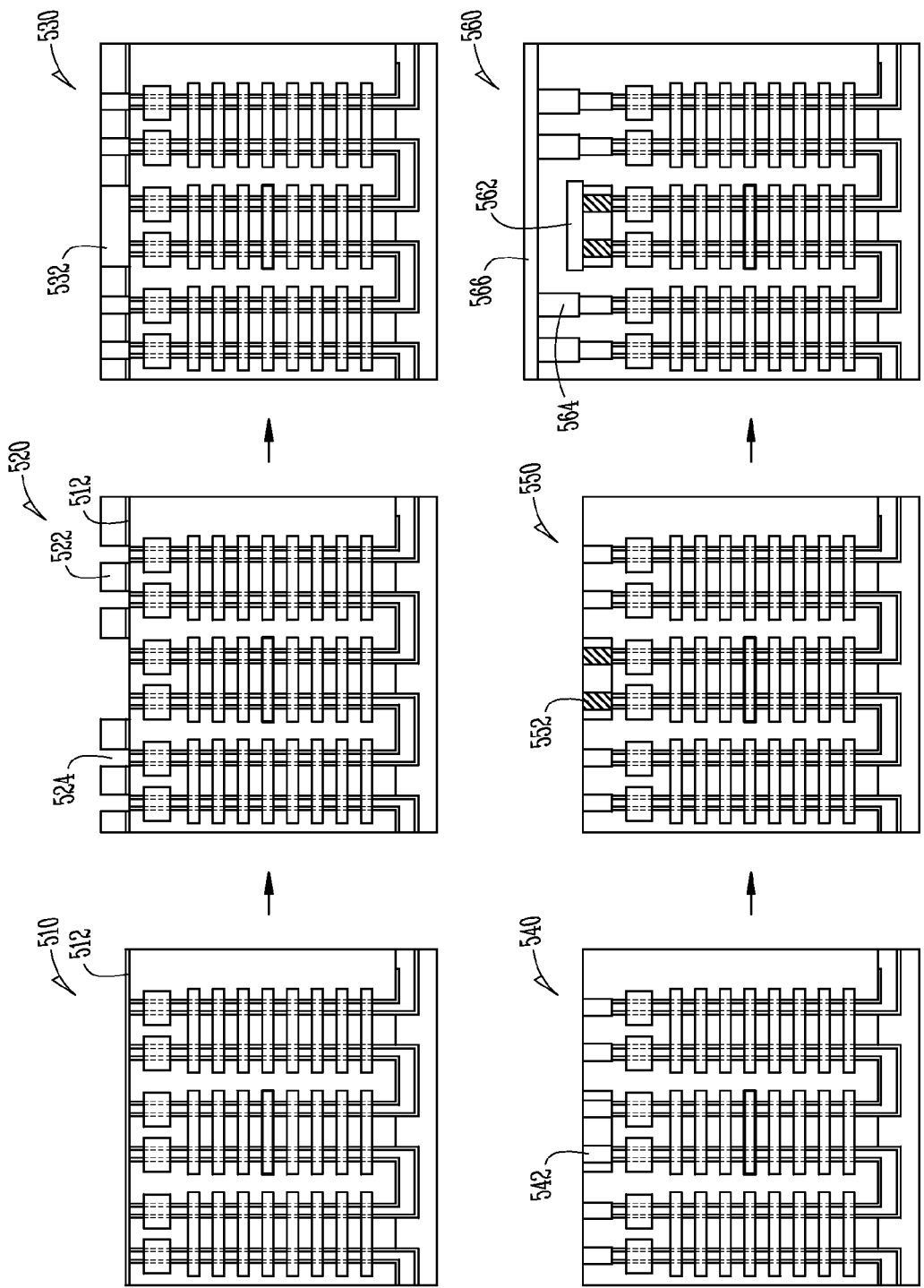
FIG. 5 shows selected stages of forming a memory device according to an embodiment of the invention.

FIG. 5 illustrates an example process flow to form selected portions of a memory device according to an embodiment of the invention. In particular, the example process flow of FIG. 5 illustrates one method of directly coupling an elongated body region to a sourceline. Operation 510 illustrates a planarization and etch stop operation. In one embodiment, an etch stop layer 512 is a silicon nitride (SiN) layer. Operation 520 illustrates a dielectric layer 522 deposition and patterning step. A number of openings 524 are shown formed in the dielectric layer 522 by etching or other suitable process. Operation 530 illustrates formation of source regions and drain regions by filling in the number of openings 524 with an n doped semiconductor. In one embodiment, the number of openings 524 are filled with an n+ polysilicon material Operation 540 illustrates formation of a second number of openings 542 within the filled portion that will become source regions. In operation 550, the second number of openings 542 are filled to form an extension of the elongated body regions. In one example, the second number of openings 542 are filled with the same material as the elongated body region. In one example, the second number of openings 542 are filled with p+ polysilicon. Operation 560 illustrates a routing layer formation. Sourcelines 562, plugs 564 and bitlines 566 may be formed as part of the routing layer formation.

Figure 6:
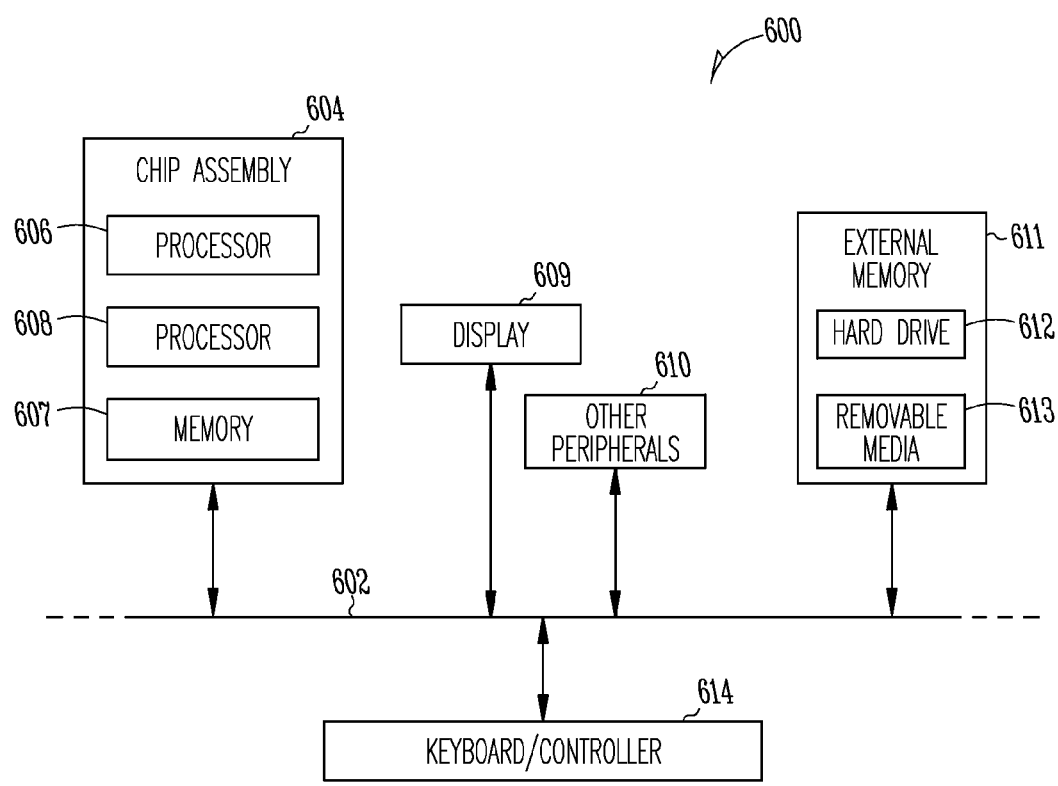
FIG. 6 shows an information handling system using a memory device according to an embodiment of the invention.

An embodiment of an information handling system such as a computer is included in FIG. 6 to show an embodiment of a high-level device application for the present invention. FIG. 6 is a block diagram of an information handling system 600 incorporating a memory device according to embodiments of the invention as described above. Information handling system 600 is merely one embodiment of an electronic system in which decoupling systems of the present invention can be used. Other examples include, but are not limited to, tablet computers, cameras, personal data assistants (PDAs), cellular telephones, MP3 players, aircraft, satellites, military vehicles, etc.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 604 may include any circuit or operably compatible combination of circuits. In one embodiment, chip assembly 604 includes a processor 606 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory device 607 is included in the chip assembly 604. In one embodiment, the memory device 607 includes a NAND memory device according to embodiments described above.

In one embodiment, additional logic chips 608 other than processor chips are included in the chip assembly 604. An example of a logic chip 608 other than a processor includes an analog to digital converter. Other circuits on logic chips 608 such as custom circuits, an application-specific integrated circuit (ASIC), etc. are also included in one embodiment of the invention.

Information handling system 600 may also include an external memory 611, which in turn can include one or more memory elements suitable to the particular application, such as one or more hard drives 612, and/or one or more drives that handle removable media 613 such as compact disks (CDs), flash drives, digital video disks (DVDs), and the like. A semiconductor memory die constructed as described in examples above is included in the information handling system 600.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A method of operating a memory device, the method comprising:
    biasing a data line to a first potential, where the data line is coupled to a first end of a first string of memory cells and to a first end of a second string of memory cells;
    biasing a source to a second potential substantially the same as the first potential, where the source is coupled to a second end of the first string and to a second end of the second string of memory cells;
    deactivating a select gate coupled between the first end of the second string of memory cells and the data line; and
    performing a programming operation on a selected memory cell of the first string of memory cells concurrently with biasing the data line to the first potential and the source to the second potential and while the select gate is deactivated.

2. The method of claim 1, wherein the select gate comprises a first select gate and further comprising activating a second select gate concurrently with performing the programming operation, wherein the second select gate is coupled between the first end of the first string of memory cells and the data line.

3. The method of claim 2, wherein activating the second select gate further comprises activating the second select gate by biasing a control gate of the second select gate to a third potential where the third potential is greater than the first potential.

4. The method of claim 3, further comprising deactivating a third and a fourth select gate concurrently with performing the programming operation, wherein the third select gate is coupled between the second end of the second string of memory cells and the source, and where the fourth select gate is coupled between the second end of the first string of memory cells and the source.

5. The method of claim 3, further comprising biasing unselected memory cells of the first string of memory cells to a fourth potential sufficient to activate the unselected memory cells concurrently with performing the programming operation.

6. The method of claim 1, wherein performing a programming operation on a selected memory cell further comprises performing a programming operation by applying a programming potential to a control gate of the selected memory cell to increase a threshold voltage of the selected memory cell.

7. A method of operating an array of memory cells, the method comprising:
    applying a potential to a data line, where the data line is coupled to a first end of a first string of memory cells and to a first end of a second string of memory cells;
    applying substantially the same potential to a source, where the source is coupled to a second end of the first string of memory cells and to a second end of the second string of memory cells;
    activating a first select gate coupled between the first end of the first string of memory cells and the data line;
    deactivating a second select gate coupled between the first end of the second string of memory cells and the data line; and
    applying a programming potential to a selected memory cell of the first string of memory cells configured to increase a threshold voltage of the selected memory cell;
    wherein the programming potential is applied concurrently with applying substantially the same potential to the data line and source and with activating the first select gate and deactivating the second select gate.

8. The method of claim 7, wherein the potential applied to the data line is less than a potential applied to the first select gate to activate the first select gate.

9. The method of claim 7, further comprising reading a selected memory cell of the first string of memory cells, wherein the data line is biased to approximately 0.5 volts and the source is biased to approximately zero volts, a selected memory cell gate is biased to a read voltage, and unselected memory cell gates are biased to a pass voltage.

10. The method of claim 9, wherein the read voltage is between zero and four volts depending on a program state being read.

11. The method of claim 10, wherein the pass voltage is approximately six volts.

* * * * *